(12) United States Patent
Dudelzak et al.

(10) Patent No.: US 6,498,801 B1
(45) Date of Patent: Dec. 24, 2002

(54) SOLID STATE LASER FOR MICROLITHOGRAPHY

(76) Inventors: Alexander E. Dudelzak, 48 Sheehan Crescent, Nepean, Ontario (CA), K2H 8M2; Guerman Pasmanik, 401 Magnetic Drive Unk 43, Toronto (CA), M3J 3H9

( * ) Notice: Subject to any disclaimer, the term of this patent is extended or adjusted under 35 U.S.C. 154(b) by 0 days.

(21) Appl. No.: 09/368,525

(22) Filed: Aug. 5, 1999

(51) Int. Cl.$^7$ ................................................. H01S 3/10
(52) U.S. Cl. ......................................................... 372/22
(58) Field of Search ............................................. 372/22

(56) References Cited

U.S. PATENT DOCUMENTS

| | | | |
|---|---|---|---|
| 4,297,600 A | * 10/1981 | Trutna, Jr. .................. 307/426 |
| 4,486,884 A | * 12/1984 | White .............................. 372/3 |
| 4,628,513 A | * 12/1986 | White .............................. 372/3 |
| 4,633,103 A | * 12/1986 | Hyman et al. .................. 372/3 |
| 5,018,161 A | 5/1991 | Sandstrom et al. |
| 5,033,051 A | * 7/1991 | Werner |
| 5,062,112 A | * 10/1991 | Buchman et al. ............... 372/3 |
| 5,088,096 A | * 2/1992 | Pocholle et al. ............... 372/3 |
| 5,586,134 A | 12/1996 | Palash et al. |
| 5,673,281 A | 9/1997 | Byer |
| 5,721,748 A | * 2/1998 | Injeyan et al. .................. 372/3 |
| 5,742,626 A | * 4/1998 | Mead et al. ................... 372/22 |
| 5,796,761 A | 8/1998 | Injeyan et al. |

OTHER PUBLICATIONS

V.I. Bespalov and G.A. Pasmanik, *Nonlinear Optics and Adaptive Laser Systems* Nova science Publishers, Inc. (NY 1994), pp. 35–65 & pp. 117–134.
W. Koechner, *Solid–State Laser Engineering 3rd Edition*; spring–Verlag (Berlin, 1992), pp. 508–545.

* cited by examiner

*Primary Examiner*—Leon Scott, Jr.
(74) *Attorney, Agent, or Firm*—Robert A. Wilkes; Robert G. Hendry; Harold C. Baker

(57) ABSTRACT

A multiple stage laser system that produces coherent light in the ultraviolet range using phase conjugated Stimulated Raman Scattering and harmonic generation. The system uses a pump laser producing an input beam that is frequency shifted via phase conjugating Stimulated Raman Scattering. The Raman shifted beam is passed through a harmonic generation stage that produces the desired output beam by generating the required harmonic of the Raman shifted beam.

18 Claims, 9 Drawing Sheets

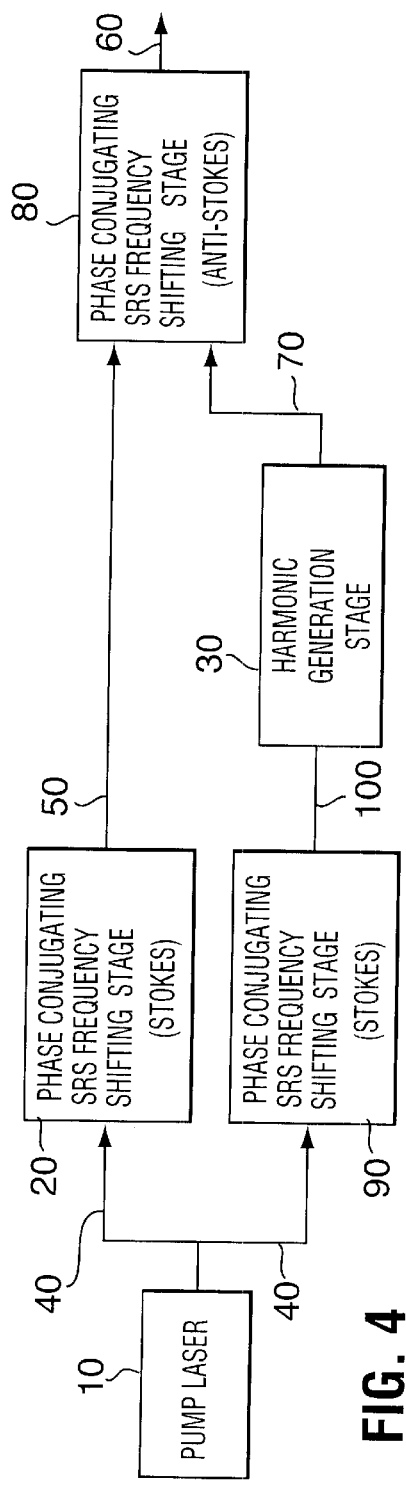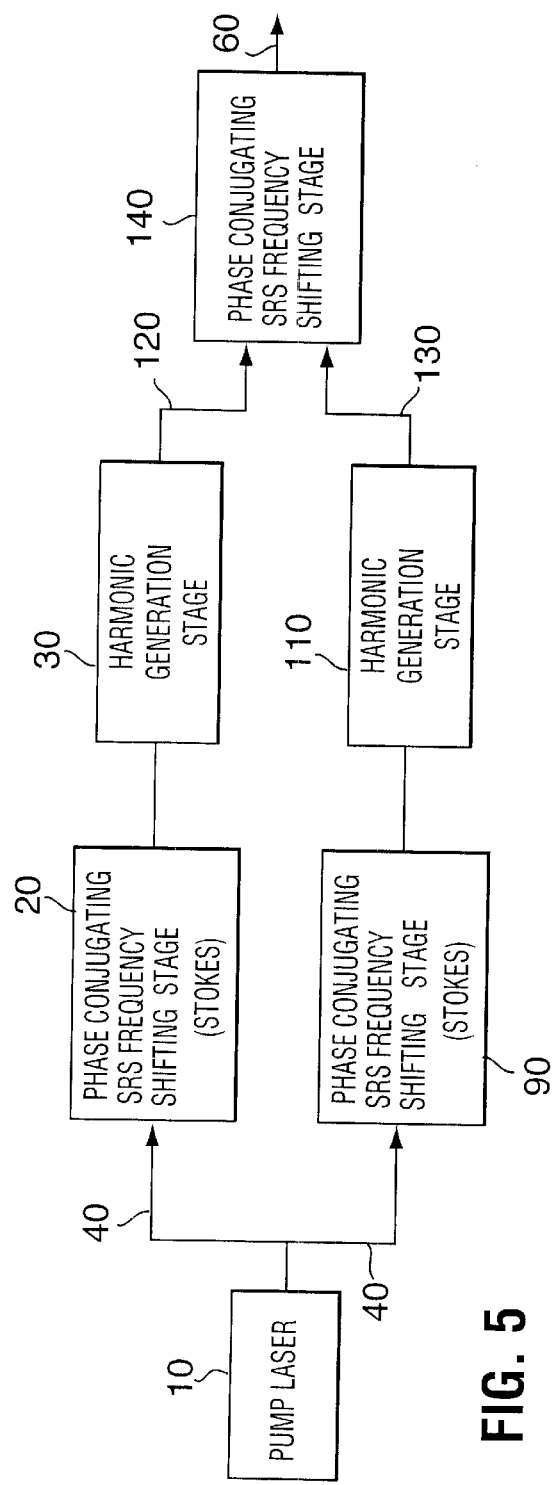

SOLID STATE LASER FOR MICROLITHOGRAPHY

FIELD OF INVENTION

This invention relates to solid state lasers and particularly to diode-pumped solid state lasers that utilize phase conjugating Stimulated Raman Scattering (SRS) to generate the desired beam wavelengths suitable for microlithography and other applications.

BACKGROUND TO THE INVENTION

The field of microlithography and the lasers needed to etch electronic microchips is burgeoning. At the present state of technology, one of the limiting parameters to smaller microchips and higher component density on such chips is the wavelength of the coherent light etching the components on the substrate. The quality of the chip circuitry and the economic viability of the production methods depend on a number of factors arising from the laser used for etching. These factors are the laser's emission wavelength, the laser's beam divergence and beam profile, the beam's pulse duration, the beam's pulse repetition rate, and the laser's overall compactness and safety.

The laser's emission wavelength determines the resolution that can be achieved on the individual chip. The shorter the laser's emission wavelength, the higher the resolution that can be achieved. Since higher resolutions lead to higher component densities on the chip, this translates to more valuable chips.

The laser's beam divergence and profile also affect the viability of the production method. A beam divergence that is too high, in conjunction with other beam parameters, renders a laser unsuitable for microlithographic applications. For the intended application, it is desirable to bring the laser's beam divergence closer to the diffraction-limited, plane-wave, TEM00 single mode.

A high pulse repetition rate coupled with shorter pulse durations lowers the probability of damaging the manufactured components. Thus, it is desirable to have higher pulse repetition rates and, within certain limits, shorter pulse durations. The laser system's overall compactness and work safety factor relate simply to the cost of chip fabrication plants.

Today's mature excimer lasers can directly generate in the sub-200 nm wavelength range of the ultraviolet (UV) spectrum. However, these lasers have some unfortunate drawbacks. These excimer lasers, such as those outlined in U.S. Pat. No. 5,586,134 issued to Palash et al. and in U.S. Pat. No. 5,018,161 issued to Sandstrom et al., require the use of dangerous halogen materials such as xenon fluoride (XeF), krypton fluoride (KrF), argon fluoride (ArF) and others. The use of such gases necessitates large gas processing, storage and circulation technologies. Also, using such lasers in a fabrication plant requires changing the air inside the plant entirely every several hours for safety purposes. These lasers are bulky, complex, potentially hazardous, and expensive. Furthermore, these excimer lasers cannot generate at pulse repetition rates much higher than 1 kHz, and their beam mode is quite far from the desired $TEM_{00}$ single mode.

On the other hand, solid state lasers do not suffer from the safety, repetition rate, and beam mode drawbacks of excimer lasers. Solid state lasers do not use dangerous gases and this eliminates the added expense and potential harm such gases can cause. Not only that, but solid state lasers can be pulsed at multi-kHz repetition rates that are much higher than that of excimer lasers. Furthermore, the beam quality of solid-state lasers can be close to the ultimately possible diffraction limit. However, solid state lasers do not directly emit in the desired UV range. The optical frequency, and thereby the wavelength, of the solid state laser's emission must therefore be converted to the desired wavelength range to make them suitable for microlithography.

Such a conversion can be achieved by directly multiplying the optical frequency, a method known as harmonic generation. Harmonic generation is the most common method of frequency conversion (see e.g. W. Koechner. "Solid-State Laser Engineering", $3^{rd}$ Edition, Springer-Verlag, Berlin, 1992). However, this method does not allow the generation of wavelengths other than the initial wavelength divided by an integer factor.

Fortunately, there are other methods that allow the production of UV emission from solid state lasers. One method that is utilized in U.S. Pat. No. 5,742,626 issued to Mead et al. is the use of an optical parametric oscillator (OPO). This method is based on a nonlinear process that includes producing two independent, separated beams from the initial single beam. This approach suffers from an unfortunate practical shortcoming. The method necessitates combining two separated beams to produce the desired UV output beam. A sum frequency generator would combine the OPO-produced beam with the fifth harmonic of the input laser beam. While combining such beams is theoretically and experimentally possible, achieving the necessary efficiency to make the method useful will be very difficult, if not practically impossible. One reason for this is that it is very difficult to achieve the precision required to align independent, separated beams with the necessary parallelism. Also, the pulses produced by the laser and by the OPO have different temporal shapes, further complicating the efficient mixing of the beams. Also, the OPO's jitter and the substantially broadened spectrum preclude efficient mixing. The above reasons therefore render the method and apparatus of Mead et al. to be impractical.

Another method for frequency conversion that produces different wavelengths from fixed wavelength solid state lasers is the use of Stimulated Raman Scattering (SRS). Raman scattering is a process in which light is scattered at frequencies which are the sum and the difference between the incident frequency and the oscillation/vibration frequencies of the scattering material. When a scattering material is irradiated by a monochromatic light that has a frequency which does not correspond to any of the absorption lines of the material, frequency shifted components of the light can be detected in the scattered radiation. These shifted components have shifts independent of the irradiation frequency but characteristic of the scattering material. A laser beam, when passed through a scattering material—or Raman medium—produces shifted lines on the low frequency side and shifted lines on the high frequency side. The shifted lines on the low frequency side are called the Stokes-shifted lines and the shifted lines on the high frequency side are called the anti-Stokes shifted lines. Thus, laser light with frequency v scattered on a Raman medium consists of not only the initial frequency v but also the $v-v_1$ frequency (Stokes-shifted with a longer wavelength) and the $v+v_1$ frequency (anti-Stokes shifted with a shorter wavelength) where $v_1$ is characteristic of the Raman medium.

From the above, it can therefore be seen that SRS can produce different wavelengths of light given an input beam and a judicious choice of a Raman medium. The Raman medium could be gaseous, liquid or solid. The Raman threshold and other physical conditions for frequency shifting are very different for the three types of media and this leads to substantial differences in designs of gas, liquid and solid state Raman lasers. Most known practical designs of Raman lasers use gas Raman cells. U.S. Pat. No. 4,633,103 issued to Hyman et al. uses SRS in gas cells to produce yellow light for laser guide-star applications. U.S. Pat. No. 5,796,761 issued to Cheung et al. utilizes SRS in solid Raman cells to produce a laser beam in the visible range for similar applications. U.S. Pat. No. 5,673,281 issued to Byer also proposes using an SRS frequency conversion laser, this time using a solid SRS cell, for guide star applications. However, none of the methods above can convert laser light into the UV-range with a sufficient efficiency to be suitable for microlithography.

The patent by Hyman et al. describes a classic gas-cell based Raman laser where Raman cells are placed outside the laser resonator. Neither the wavelengths it generates nor its efficiency and beam divergence allow the design to be used for producing UV coherent light suitable for microlithographic applications.

Both Cheung's and Byer's concepts employ solid Raman cells. An essential part of both their designs is Raman unit installed inside the laser resonator. This design cannot be used for UV-microlithography because the placement of the Raman shifter does not allow the selection of the resonator transverse mode. Without this ability, the desirable beam divergence and beam quality cannot be achieved. Also, when the Raman cell is placed inside the resonator, there is a fluctuating delay (jitter) between the beginning of lasing and the emission of the SRS pulse. This leads to jitter instability in the frequency sum/difference crystal that precludes the achievement of microlithography required parameters.

The most significant drawback of all the above designs is the lack of a mechanism to completely eliminate forward scattering. As a rule, forward and backward scattering accompanies the generation of higher Stokes and anti-Stokes Raman spectral components. The presence of forward scattering lowers the efficiency of concentrating optical energy in one desirable line. A high concentration efficiency is especially important for the multi-step conversion of an input beam into the UV range. Additionally, in the presence of forward scattering, the generation of the single transverse beam-mode($TEM_{00}$)—that is very essential for microlithographic applications—is practically unachievable. Forward scattering is observed with all the above designs but with the intra-cavity SRS-cell the effect is stronger, and, despite the effort taken by Cheung, it cannot be eliminated totally.

Thus, while the concepts of Cheung, Hyman, and Byer are well suited for guide-star and other applications that do not require the best possible beam quality, none of them is readily applicable to microlithography.

To achieve an output beam in the $TEM_{00}$-mode using SRS, the forward scattering must be entirely eliminated. This can be done by using the so called phase-conjugation geometry (see, e.g. V. Bespalov, and G. Pasmanik. "Non-Linear Optics and Adaptive Systems", Nova Science Publishers, New York, 1993). The phase conjugation principle, in simplest terms, is capable of inverting both the direction of propagation and the phase for each plane wave component of the incoming light beam. Without phase conjugation, the output of a Raman cell, given an input beam that is in the $TEM_{00}$-mode, will be not be in the $TEM_{00}$-mode. This change in mode is due to the presence of forward scattering. However, by using a phase conjugating geometry of the Raman cell, the frequency shifted beams will not have the undesirable forward scattering. Thus, if the input to a phase conjugating Raman cell is in the $TEM_{00}$-mode, the output will also be a phase conjugated Stokes shifted beam in the $TEM_{00}$-mode.

A combination of the frequency conversion methods outlined above and of the phase conjugation geometry would therefore produce a beam with the desired characteristics from a solid state laser. The frequency conversion methods would allow the generation of UV light while the phase conjugation geometry would eliminate the undesirable effect of Raman scattering—forward scattering.

What is therefore required is a laser system that combines the frequency conversion methods outlined above with the concept of phase conjugation to produce laser light in the UV range with the characteristics that make that light suitable for microlithography.

SUMMARY OF THE INVENTION

The present invention overcomes the deficiencies identified in the prior art. The present invention provides a multiple stage solid state laser system producing an output beam having an output wavelength in the desirable ultraviolet range, the system comprising a first stage including an input beam stage producing an input beam, a plurality of further stages, each stage being chosen from the group comprising a phase conjugating frequency conversion stage, and a harmonic generation stage wherein each stage of the system is optically coupled to at least one other stage.

Preferably, the system includes a second stage comprising a first phase conjugating frequency conversion stage coupled to receive the input beam and producing a first phase conjugated Stokes shifted beam.

More preferably, the laser system includes a third stage comprising a harmonic generation stage coupled to receive the phase conjugated Stokes shifted beam and producing a Stokes harmonic beam that is a fixed harmonic of the first phase conjugated Stokes shifted beam.

Also preferably, the laser system includes a third stage comprising a harmonic generation stage coupled to receive the input beam and producing a harmonic beam that is a fixed harmonic of the input beam.

More preferably, the laser system includes a fourth stage comprising a second phase conjugating frequency conversion stage coupled to receive the harmonic beam and the first phase conjugated Stokes shifted beam and producing a phase conjugated anti-Stokes shifted beam.

Conveniently, the laser system includes a second stage comprising a harmonic generation stage coupled to receive the input beam and producing a harmonic beam that is a fixed harmonic of the input beam.

More conveniently, the laser system includes a third stage comprising a phase conjugating frequency conversion stage coupled to receive the harmonic beam and producing an output beam.

Also conveniently, the laser system includes a third stage comprising a second phase conjugating frequency conversion stage coupled to receive the input beam and producing a second phase conjugated Stokes shifted beam.

More conveniently, the laser system further includes a fourth stage comprising a harmonic generation stage coupled to receive the first phase conjugated Stokes shifted beam and producing a Stokes harmonic beam that is a fixed harmonic of the first phase conjugated Stokes shifted beam.

Most conveniently, the laser system further includes a fifth stage comprising a third phase conjugating frequency conversion stage coupled to receive the second phase conjugated Stokes shifted beam and the Stokes harmonic beam. The fifth stage also produces a phase conjugated anti-Stokes shifted beam.

Alternatively, the laser system further includes fourth and fifth stages
wherein the fourth stage comprises a first harmonic generation stage coupled to receive the first phase conjugated Stokes shifted beam and producing a first Stokes harmonic beam and
wherein the fifth stage comprises a second harmonic generation stage coupled to receive the second phase conjugated Stokes shifted beam and producing a second Stokes harmonic beam.

Furthermore, it is preferable that the laser system includes an output stage comprising a frequency conversion stage coupled to receive both the first and the second Stokes harmonic beams.

More preferably, the laser system further includes an output stage comprising a harmonic generation stage coupled to receive both the first and the second Stokes harmonic beams.

Also preferably, the frequency conversion stage of the laser system includes components chosen from the group comprising a phase conjugating SRS Stokes cell transmitting a phase conjugated Stokes shifted beam and a phase conjugating SRS anti-Stokes cell transmitting a phase conjugating anti-Stokes shifted beam.

In another embodiment, the invention provides a laser system comprising an input beam source and a plurality of optical devices for altering the frequency of a laser beam including at least one phase conjugating Raman medium cell and an optical harmonic generation apparatus wherein the input beam source is optically coupled to at least one of the plurality of optical devices for altering the frequency of a laser beam.

Yet another embodiment of the invention provides for a method of producing laser light having a wavelength in the ultraviolet range, the method comprising:
producing a pulsed input beam from an input beam source
passing the input beam through at least one initial wavelength altering apparatus to produce at least one first intermediate beam, the initial wavelength altering apparatus being chosen from the group comprising:
a phase conjugating Raman medium cell
an optical harmonic generation apparatus.

Preferably, the method further includes passing the at least one first intermediate beam through a secondary wavelength altering apparatus to produce an output beam, the secondary wavelength apparatus being chosen from the group comprising:
a phase conjugating Raman medium cell
an optical harmonic generation apparatus.

Alternatively, the method further includes passing the first intermediate beam through a secondary wavelength altering apparatus to produce a second intermediate beam, the secondary wavelength apparatus comprising a phase conjugating Raman medium cell producing a phase conjugated anti-Stokes shifted beam.

Conveniently, the method further includes the step of using at least one phase conjugating SRS Stokes cell to produce a phase conjugated Stokes shifted beam.

Preferably, the method further includes the step of using an optical harmonic generation apparatus to produce fixed harmonics of a laser beam.

Also preferably, the method further includes the step of using at least one phase conjugating SRS Anti-Stokes cell to produce a phase conjugated anti-Stokes shifted beam.

The advantages of the present invention are numerous. Diode-pumped lasers can be used with this invention to provide high repetition rates. Desirable UV laser light can be produced without complex gas handling mechanisms such as those used in excimer lasers. The use of SRS to shift the input beam frequency allows for a wide range of output beam wavelengths. By judiciously choosing a phase conjugating Raman medium with the desired characteristics and by generating the required harmonics, a legion of output beam wavelengths is available. Furthermore, the high conversion efficiency of the phase conjugating SRS process reduces the need for very high power input laser beams. This leads to further cost savings. Also, phase-conjugating SRS cells produce only backward scattered beams with no forward scattering, thereby helping to achieve the $TEM_{00}$ quality of the output beam, if the input beam has the $TEM_{00}$ quality.

BRIEF DESCRIPTION OF THE DRAWINGS

A better understanding of the invention will be obtained by considering the detailed description below, with reference to the following drawings in which:

FIG. 4 is a block diagram of a fourth embodiment of the invention.

FIG. 5 is a block diagram of a fifth embodiment of the invention.

DETAILED DESCRIPTION OF THE INVENTION

Figure 1:
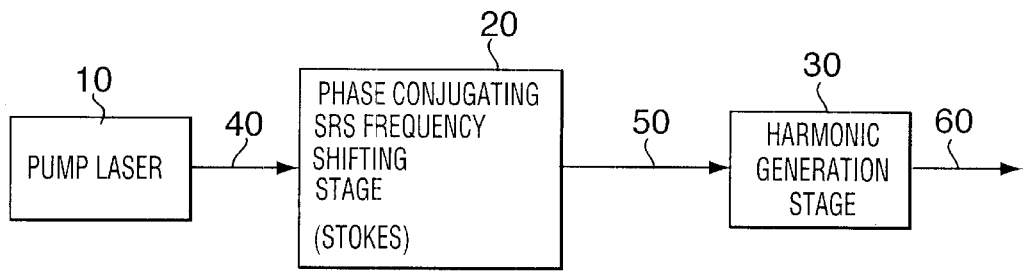
FIG. 1 is a block diagram of a first embodiment of the invention.

Referring to FIG. 1, a block diagram of a first embodiment of the invention is illustrated. This embodiment consists of a three stage device with an input/pump laser stage 10, a phase conjugating SRS Stokes shifting stage 20, and a harmonic generation stage 30. The input/pump laser stage 10 produces an input beam 40 that is received by the SRS Stokes shifting stage 20. The phase conjugating SRS Stokes shifting stage 20 then produces a Stokes shifted second beam 50 that is received by the harmonic generation stage 30. This final stage produces an output beam 60 with the desired wavelength.

Figure 2:
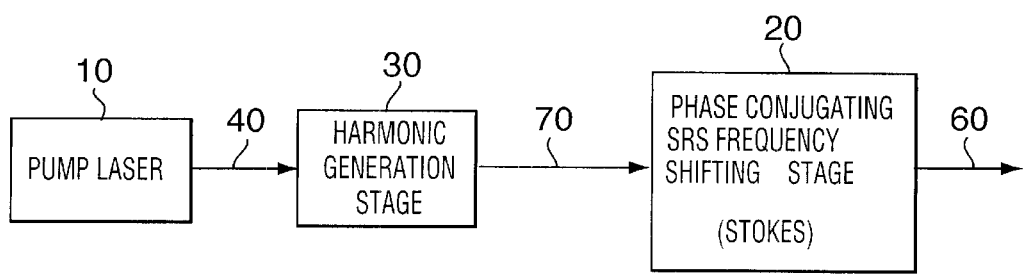
FIG. 2 is a block diagram of a second embodiment of the invention.

FIG. 2 shows a block diagram of a second embodiment of the invention. This three stage device is similar to that illustrated in FIG. 1 except that the positions of the phase conjugating SRS Stokes shifting stage 20, and the harmonic generation stage 30 is reversed. The harmonic generation stage 30 receives the input beam 40 from the input/pump laser stage 10 and produces a harmonic beam 70 that is received by the SRS Stokes shifting stage 20. The SRS Stokes shifting stage 20 produces the output beam 60 with the desired wavelength.

Figure 3:
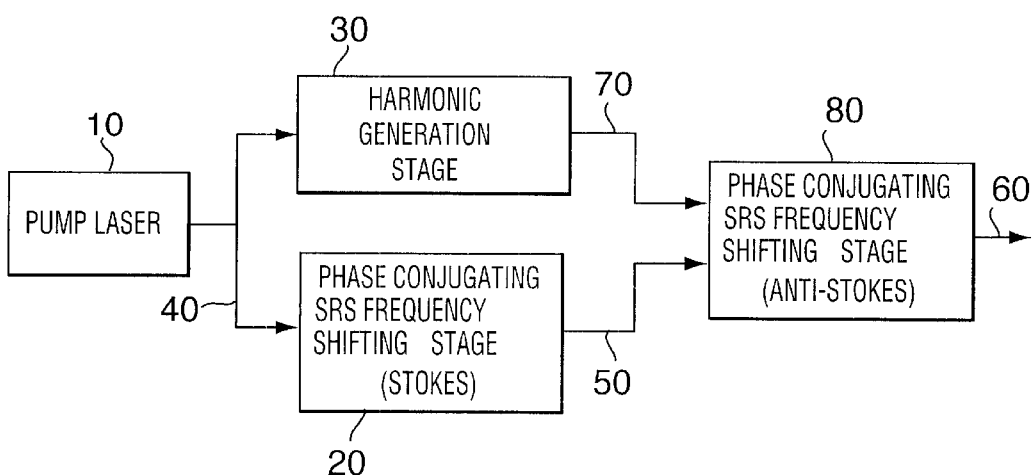
FIG. 3 is a block diagram of a third embodiment of the invention.

FIG. 3 shows a block diagram of a third embodiment of the invention using SRS anti-Stokes shifting along with SRS Stokes shifting. The first stage is, similar to FIG. 1, an input/pump laser stage 10 producing an input beam 40. This first beam 40 is received by a similar harmonic generation (HG) stage 30 and a phase conjugating SRS Stokes shifting stage 20. The HG stage 30 produces a harmonic beam 70 that is received by the phase conjugating SRS anti-Stokes shifting stage 80. The phase conjugating SRS Stokes shifting stage 20 produces a Stokes shifted second beam 50 also received by the phase conjugating SRS anti-Stokes shifting stage 80. This anti-Stokes shifting stage 80 produces the output beam 60.

FIG. 4 shows a block diagram of a fourth embodiment of the invention using SRS anti-Stokes shifting along with two SRS Stokes shifting stages. The first stage is, similar to FIGS. 1 and 2, an input/pump laser stage 10 producing an input beam 40. This first beam 40 is received by two phase conjugating SRS Stokes shifting stages 20 and 90. The first phase conjugating SRS Stokes shifting stage 20 produces a Stokes shifted second beam 50 received by the phase conjugating SRS anti-Stokes shifting stage 80. The second phase conjugating SRS Stokes shifting stage 90 produces an intermediate Stokes shifted beam 100 that is received by the harmonic generation (HG) stage 30. The HG stage 30 produces a harmonic beam 70 that is also received by the phase conjugating SRS anti-Stokes shifting stage 80. This anti-Stokes shifting stage 80 produces the output beam 60.

Figure 6:
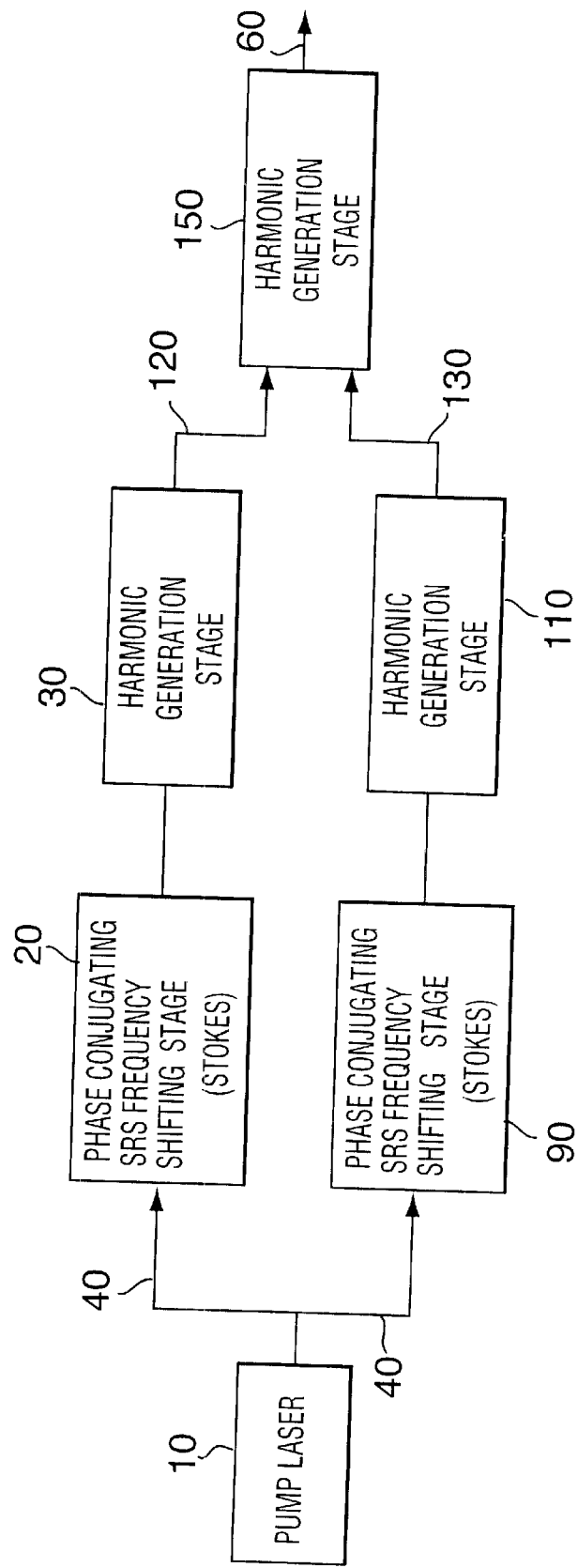
FIG. 6 is a block diagram of a sixth embodiment of the invention.

FIGS. 5 and 6 illustrate, respectively, fifth and sixth embodiments of the invention. The input stage 10 in both these embodiments is similar to the input stage 10 in the previous embodiments. Both of these embodiments also have a first Stokes shifting stage 20 and a second Stokes shifting stage 90. These Stokes shifting stage 20 and 90 both receive the input beam 40. Optically connected to the shifting stages 20 and 90, respectively, are a first harmonic generation stage 30 and a second harmonic generation stage 110. Each of these harmonic generation stages 30 and 110 produce harmonic beams 120 and 130 of the Stokes shifted beam they receive. The main difference between these two embodiments is the final stage that receives the two Stokes harmonic beams. For FIG. 5 the final stage is another Raman cell 140. Depending on the input beam wavelength, Stokes shifting stages 20 and 90, and the harmonic generation stages 30 and 110, this final Raman cell 140 can be either a Stokes shifting stage or an anti-Stokes shifting stage. For FIG. 6, the final stage is another harmonic generation stage 150. The parameters of this final harmonic generation stage is, again, dependent on the previous stages.

Of the components so far mentioned, it should be noted that the HG stage 30 produces different harmonics of its beam input. Thus, if as in FIG. 1, the input beam to the HG stage 30 is the SRS Stokes shifted beam 50, the HG stage will produce different harmonics of the Stokes shifted beam 50. If, on the other hand, the HG stage received the input beam 40 as in FIG. 2, the HG stage 30 will produce harmonics of this input beam 40. Similarly, the HG stage 30 in FIG. 3 will produce harmonics of its input beam 65.

SRS Stokes shifting cell and SRS anti-Stokes shifting cells are well-known in the art. However, these conventional cells will not suffice as, given the outline above, they do not eliminate the forward scattering that is attendant with Raman scattering. Thus, such cells must be made phase conjugating so that they can be used for the invention. Using the principles outlined in the text by Bespalov and Pasmanik, an SRS cell can be made phase-conjugating by focusing the incident laser light at the cell using a lens. The focusing must meet certain conditions depending on the beam pulse parameters and characteristics of the Raman cell material. These characteristics are needed to select the proper material to produce the desired wavelength $v_s$. For a given material, the required frequency shift $v_R = v_L - v_S$ can also be achieved by selecting another initial laser beam optical frequency $v_L$. The parameters needed for finding the focusing conditions are:

nonlinearity gain factor g (cm/MW);

dispersion curves $n(v_L)$, $n(v_s)$ and $n(v_a)$ near the laser frequency/wavelength $v_L/\lambda_L$;

Stokes frequency $v_s$ and anti-Stokes frequency $v_a = v_L + v_R$;

surface and bulk damage intensities $I_{d1}$ and $I_{d2}$ as functions of the pulsewidth T and of the pumping beam area.

The material threshold damage power $P_d$ at the focal waist area $A_f$ must be compared with the SRS threshold power $P_{th} = M/gk$, where $$k = (2\pi/\lambda_L)n(\lambda_L)$$

is the wave vector, g is the non-linearity gain factor, and M is the threshold total gain that also depends on, among other things, the wavelength, the pulsewidth, the pump beam area. Normally, M=30–35.

A Raman material can only be selected to be used in a phase-conjugating cell—producing the backward scattering and suppressing the forward scattering—if $P_{th}$ is not greater than $0.5P_d$–$0.7P_d$. To suppress the forward SRS, the conditions for strong Stokes—anti-Stokes interaction must be provided, that is:

$$\Delta k < g I_L,$$

where $\Delta k = 2n[(2v_L n(v_L) - v_s n(v_s) - v_a n(v_a)]$, and $I_L$ is the intensity of the laser beam near the focal waist area (at the distance of less than ~5–10 focal lengths).

Based on the parameters of laser pulses and of the Raman material, the input beam diameter/cross-section and the focal waist area at the Raman cell can be optimized to meet the threshold and the conversion efficiency conditions.

Given that $A_f \sim (\lambda^2/d^2)$ $F^2$ with the $TEM_{00}$ pumping, to avoid the surface damage, an optimum combination of the input beam diameter d, the lens focused beam waist area $A_f$, and the lens focal length F must be experimentally established. For example, if the Raman material is Calcite, $I_{d1} = 12$ GW/cm$^2$, $I_{d2} = 30$ GW/cm$^2$ (for the 1ns $TEM_{00}$ pumping pulse duration). Therefore, with F=50 mm, and d=1 mm, the maximum allowed power of the laser pumping pulse will be $P = I_{d1} \pi d^2/4 \equiv 100$ MW.

Raman conversion efficiency depends on the x factor showing how much the pumping beam energy $E = P\tau$ exceeds the Raman material threshold energy $E_{th} = P_{th}\tau = (0.3-0.4)$ mJ is the SRS threshold energy.

At x=100 of a phase-conjugating Raman shifter, the conversion efficiency exceeds 70% that is much higher than with the non-phase conjugating cell geometry. This and the $TEM_{00}$ quality of the output beam satisfy the requirements of laser microlithography.

From FIG. 1 it is clear that the phase conjugating SRS Stokes shifting stage is used to generate from an input beam 40 a Stokes shifted beam 50 that has a harmonic with a desired wavelength. Therefore, the Stokes shifted beam 50 must have a wavelength that is a multiple of the desired wavelength. If the desired wavelength is 193 nm, then the Stokes shifted beam 50 must have a wavelength that is a multiple of 193 nm, FIGS. 5 to 8 illustrate this principle as it shows that the wavelength of the Stokes shifted beam 50 is 1158 nm, the sixth multiple of 193 nm. Thus, the HG stage 30 must, in FIGS. 7–10, generate the sixth harmonic of the Stokes shifted beam 50 to produce the desired 193 nm output beam.

The phase conjugating SRS Stokes shifting stage 20 in the embodiment shown in FIGS. 7–10 can be constructed out of a KGW (potassium gadolinium tungstate) crystal. Alternatively, the phase conjugating SRS Stokes shifting stage 20 can be constructed out of cascaded $SnCl_4$ crystals. In this specific embodiment, the SRS stage 30 produces a Stokes shifted beam 50 having a wavelength of 1158 nm. This shifted beam 50 is then received by the HG stage 30.

FIGS. 7 to 10 illustrate different methods of producing the sixth harmonic of the Stokes shifted beam 50. As can be seen from FIGS. 7 to 10, a combination of nonlinear optical crystals can be cascaded to produce the sixth harmonic of the Stokes shifted beam 50.

Figure 7:
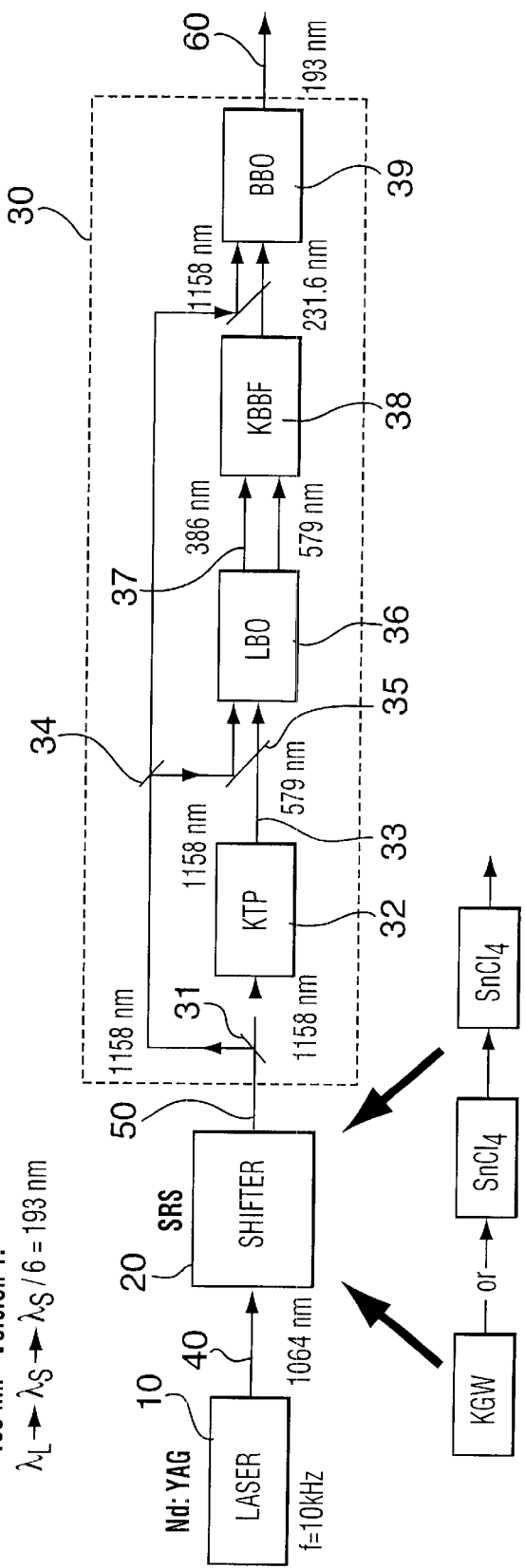
FIG. 7 is a detailed block diagram of a first possible configuration of the first embodiment of the invention.

The HG stage in FIG. 7 comprises four HG substages with each substage providing a different harmonic of the Stokes shifted beam 50. The beam splitter 31 splits the Stokes shifted beam 50 into two beams with one beam entering the frequency doubling substage 32. This frequency doubling substage 32 can be made out of a potassium titan phosphate (KTP) nonlinear optical crystal. The frequency doubling substage 32 produces a second harmonic beam 33 with half the wavelength of the Stokes shifted beam 50. This second harmonic beam 33 is combined with the Stokes shifted beam, via another beam splitter 34 and a beam combiner 35. The second substage 36 takes the Stokes shifted beam and the beam 33 and produces a third harmonic beam 37. This third harmonic beam 37 is then fed, along with the second harmonic beam to the third substage 38. This third substage 38 produces the fifth harmonic of the Stokes shifted beam. The fifth harmonic beam is then fed, along with the Stokes shifted beam, to the final substage 39. The final substage 39 produces the sixth harmonic of the Stokes shifted beam with the desired wavelength of 193 nm.

It should be noted that the second substage 36 can be constructed out of a lithium borate oxide (LBO) nonlinear optical crystal while the third substage 38 can be constructed out of a potassium fluoroboratoberillate (KBBF) nonlinear optical crystal. The final substage 39 can be constructed out of a borate berillate oxide (BBO) nonlinear optical crystal.

Figure 8:
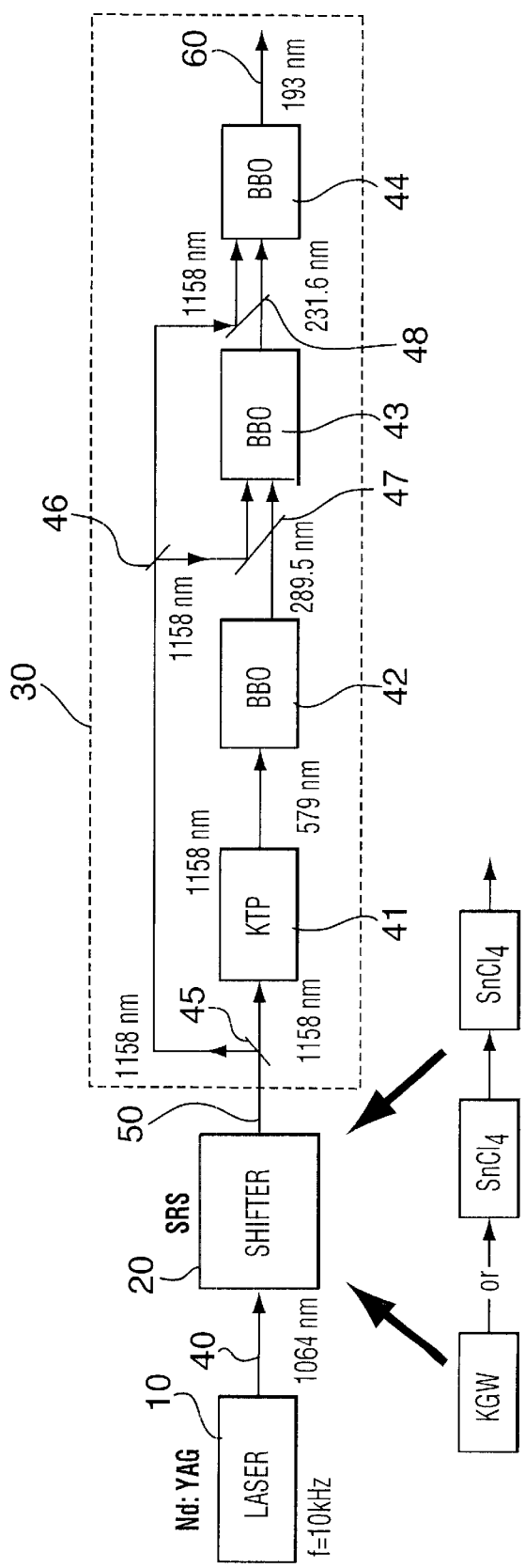
FIG. 8 is a detailed block diagram of a second possible configuration of the first embodiment of the invention.

FIG. 8 illustrates a variant of the configuration shown in FIG. 7. The HG stage 30 again has four substages. As can be seen from FIG. 8, the first substage 41 is a frequency doubler which can be manufactured out of KTP. The next three stages, substage 42, substage 43, and substage 44 can all be constructed out of BBO nonlinear optical crystals. Beam splitters 45, 46 split the Stokes shifted beam to be combined with the outputs of substages 42 and 43. Substage 42 accepts the output of frequency doubler 41 and produces the fourth harmonic of the Stokes shifted beam 50. Substage 43 receives the output of substage 42 and the Stokes shifted beam 50 via the combiner 47 to produce the fifth harmonic of the Stokes shifted beam 50. This output is then received, along with the Stokes shifted beam, via the combiner 48 into the final substage 44. This final substage 44 produces the sixth harmonic of the Stokes shifted beam 50, this sixth harmonic having the desired wavelength of 193 nm.

Figure 9:
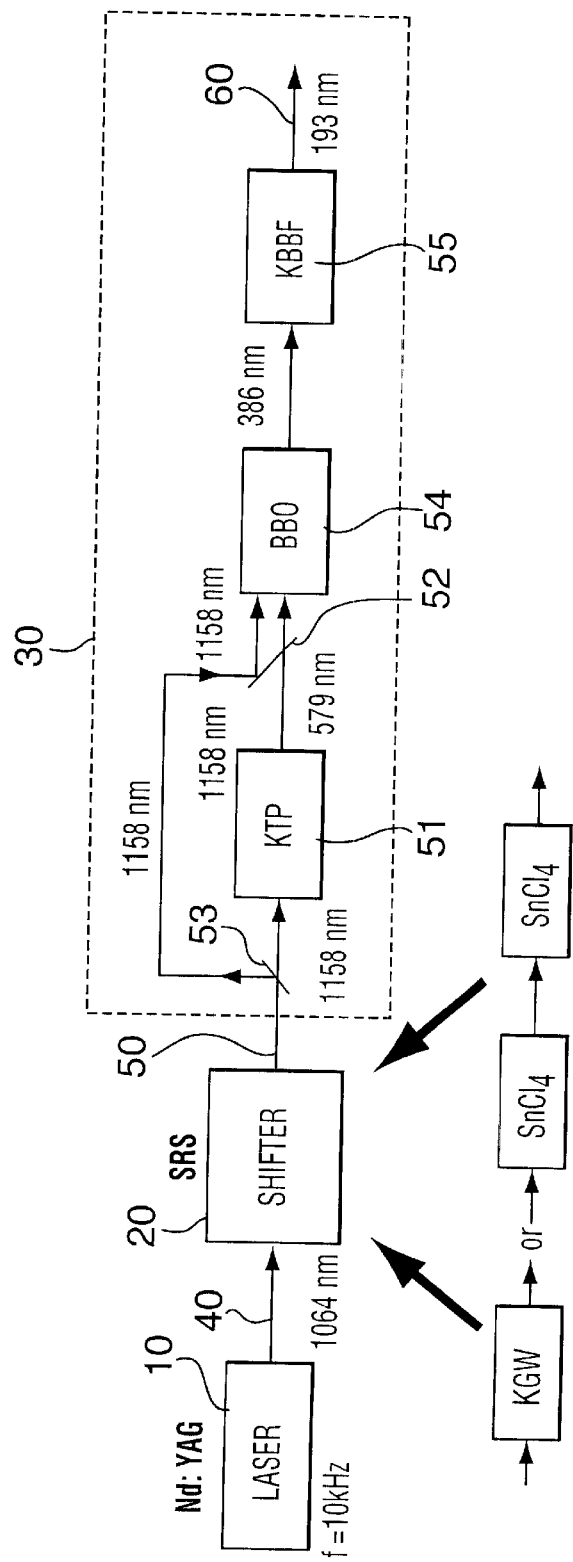
FIG. 9 is a detailed block diagram of a third possible configuration of the first embodiment of the invention.

FIG. 9 illustrates the invention with a three substage HG stage 30. The first substage is a frequency doubler 51 producing the second harmonic of the Stokes shifted beam 50. This second harmonic is combined with the Stokes shifted beam 50, via the combiner 52 and the beam splitter 53, into the second substage 54. This second substage 54 produces the third harmonic of the Stokes shifted beam. The third harmonic is then received by the final substage 55 to produce the output beam with the desired wavelength of 193 nm and a power of 0.4 mJ. The substages 51, 54, and 55 can be manufactured similarly to the substages in FIGS. 7 and 8. Substage 51 can be constructed out of a KTP crystal, substage 54 can be constructed out of a BBO crystal, and substage 55 can be constructed out of KBBF.

Figure 10:
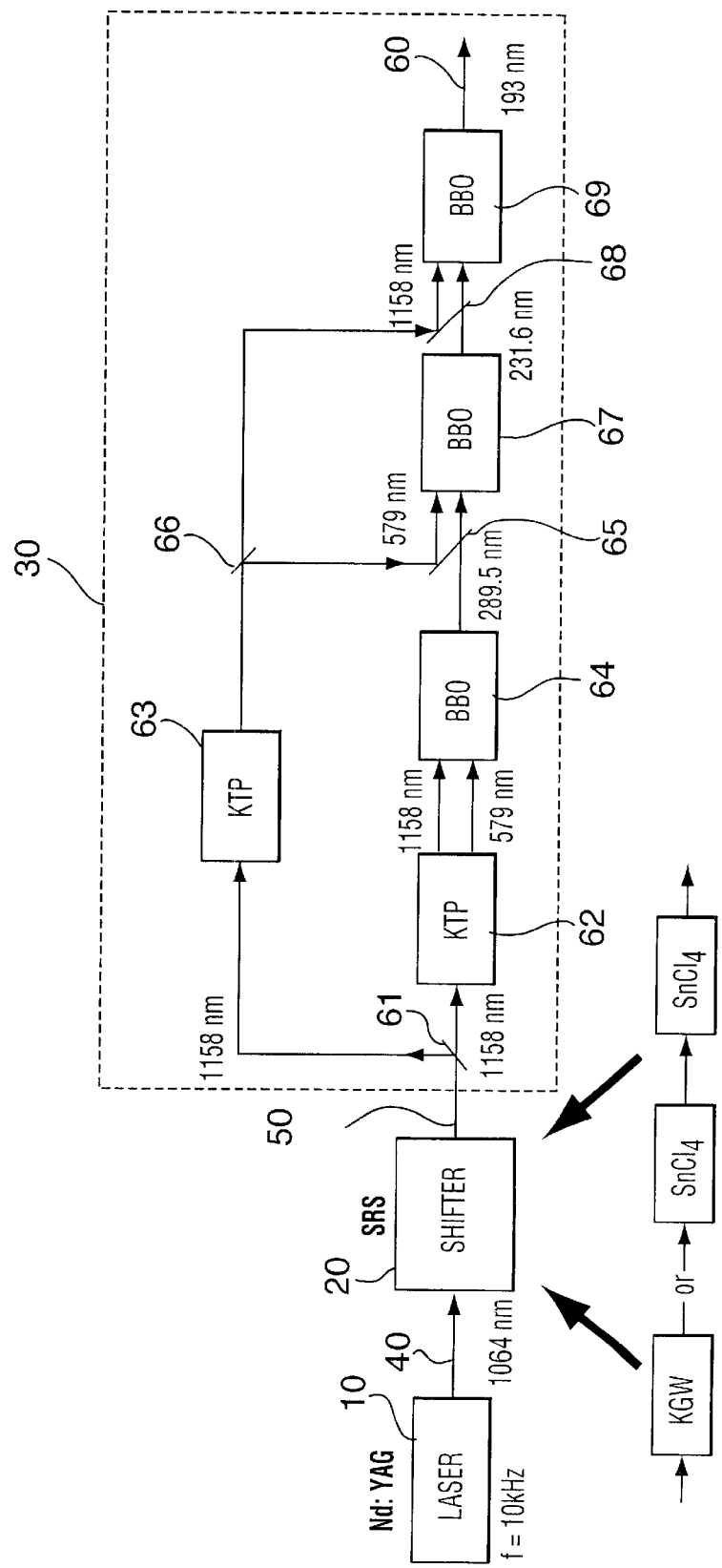
FIG. 10 is a detailed block diagram of a fourth possible configuration of the first embodiment of the invention.

A third variant of the system outlined in FIG. 1 is shown in FIG. 10. The FIG. 10 variant has four substages and an extra frequency doubler to produce the desired. wavelength of light. The beam splitter 61 splits the Stokes shifted beam 50 between two similar frequency doublers 62, and 63. These doublers can both be constructed out of a KTP crystal. The output of the doubler 62 is fed, along with the Stokes shifted beam, to the second substage 64. The second substage 64 produces the fourth harmonic of the Stokes shifted beam 50. This fourth harmonic is then combined with the output of the second frequency doubler 63 via a combiner 65 and a beam splitter 66 to the third substage 67. The third substage 67 produces the fifth harmonic of the Stoeks shifted beam 50. The output of the third substage 67 is then combined, along with the Stokes shifted beam via the combiner 68, within the final substage 69 to produce the desired output beam. This desired output beam has a wavelength of 193 nm. Much like the variant in FIG. 8, the succeeding substages 64, 67, and 69, can be constructed out of BBO crystal.

The configurations of the HG stage 30 illustrated in FIGS. 7–10 illustrate only four ways to generate the sixth harmonic of an input beam. A man skilled in the art can formulate other well-known combinations of non-linear optical crystals to generate the sixth or other required harmonics of the Stokes shifted beam 50.

The overall workings of the embodiment of the invention illustrated in FIGS. 7–10 can now be examined. The pump laser contained in the input/pump laser stage 10 produces an input beam that is received by the phase conjugating SRS Stokes shifting stage 20. The phase conjugating SRS Stokes shifting stage 20 then produces, by SRS and its attendant frequency shift, a Stokes shifted beam 50 with a wavelength that is not only a multiple of the desired output wavelength but is also longer than the wavelength of the input beam 40. This Stokes shifted beam 50 is then received by the HG stage 30. The HG stage then produces the required harmonic of the Stokes shifted beam 50.

Figure 11:
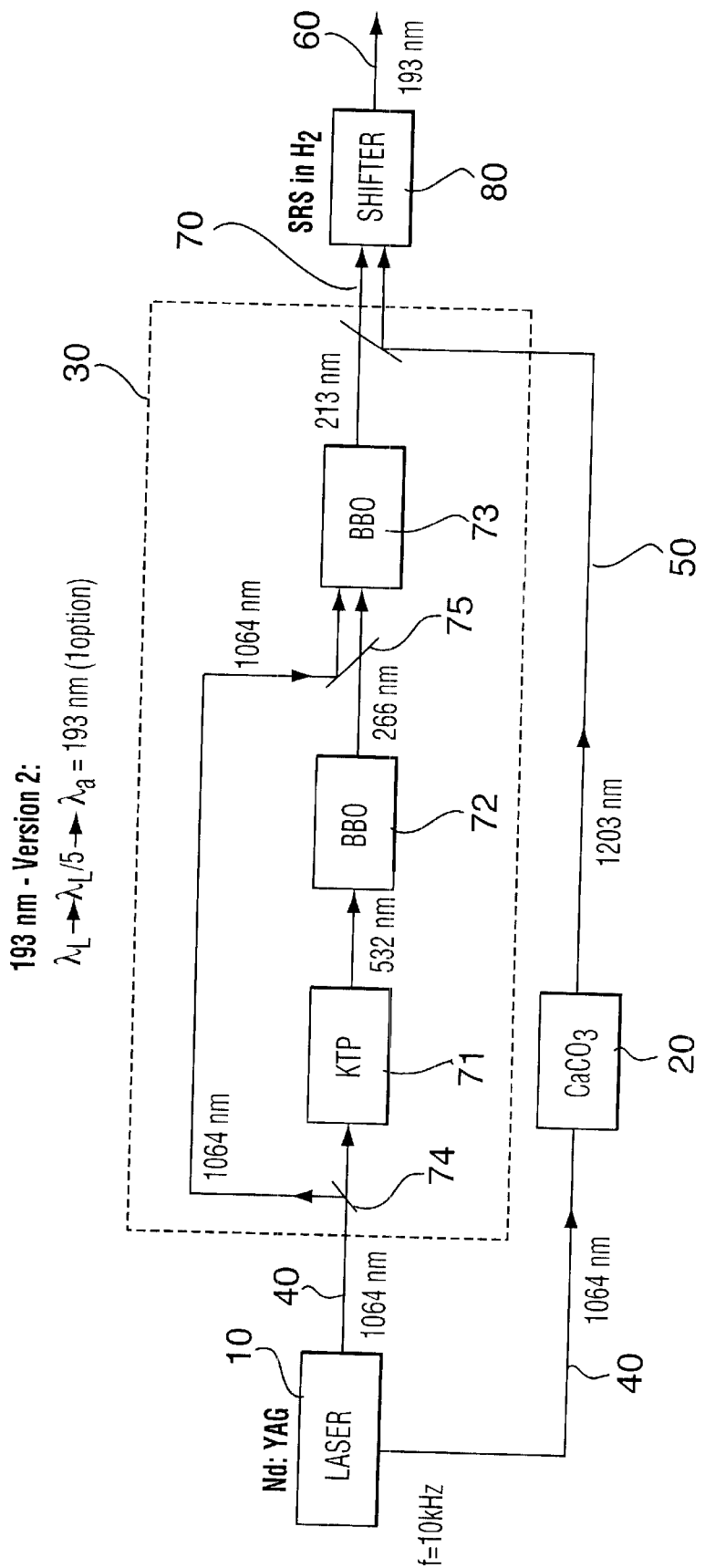
FIG. 11 is a detailed block diagram of a possible configuration of the third embodiment of the invention.

FIG. 11 illustrates a possible configuration of the block diagram shown in FIG. 3. While this configuration is similar to those shown in FIGS. 7–10, there are a number of differences. As can be seen, the HG stage 30 is between the input/pump laser stage 10 and the phase conjugating SRS anti-Stokes stage 80. Also, it should be noted that the HG stage 30 in FIG. 11 generates the fifth harmonic of its input and not the sixth harmonic as in FIGS. 7–10. Furthermore, the input to the HG stage 30 is the input beam 40 as opposed to the Stokes shifted beam 50. However, the largest difference is that one of the SRS stages in FIG. 11 comprises an SRS anti-Stokes shift stage 80 that produces a beam with a higher frequency and a shorter wavelength than its input beam. The harmonic beam 80 has a wavelength of 213 nm that, in combination with a 1203 nm wavelength Stokes shifted beam 50 from the phase conjugating SRS Stokes shift stage 20 is reduced to 193 nm through SRS antiStokes shifting. The phase conjugating SRS anti-Stokes shift stage 80 is composed of $H_2$. It should be noted that this configuration includes a phase conjugating SRS Stokes shift stage 20 constructed out of calcite crystal ($CaCO_3$), that produces a phase conjugated Stokes shifted 1203 nm wavelength beam from the input beam 40. This Stokes shifted beam 50 is fed into the phase conjugating SRS anti-Stokes shift stage 80 to produce the 193 nm output beam.

In FIG. 11, the HG stage comprises three substages 71, 72, and 73. The first substage 71 can, again, be a KTP frequency doubler. The second and third substages, 72 and 73, can be BBO nonlinear crystals with the second stages receiving the frequency doubled beam and producing the fourth harmonic of the input beam 40. The third substage 73 receives the fourth harmonic beam mentioned above and the input beam 40 via the beam splitter 74 and the half silvered mirror 75. This third substage produces the fifth harmonic of the input beam 40.

Figure 12:
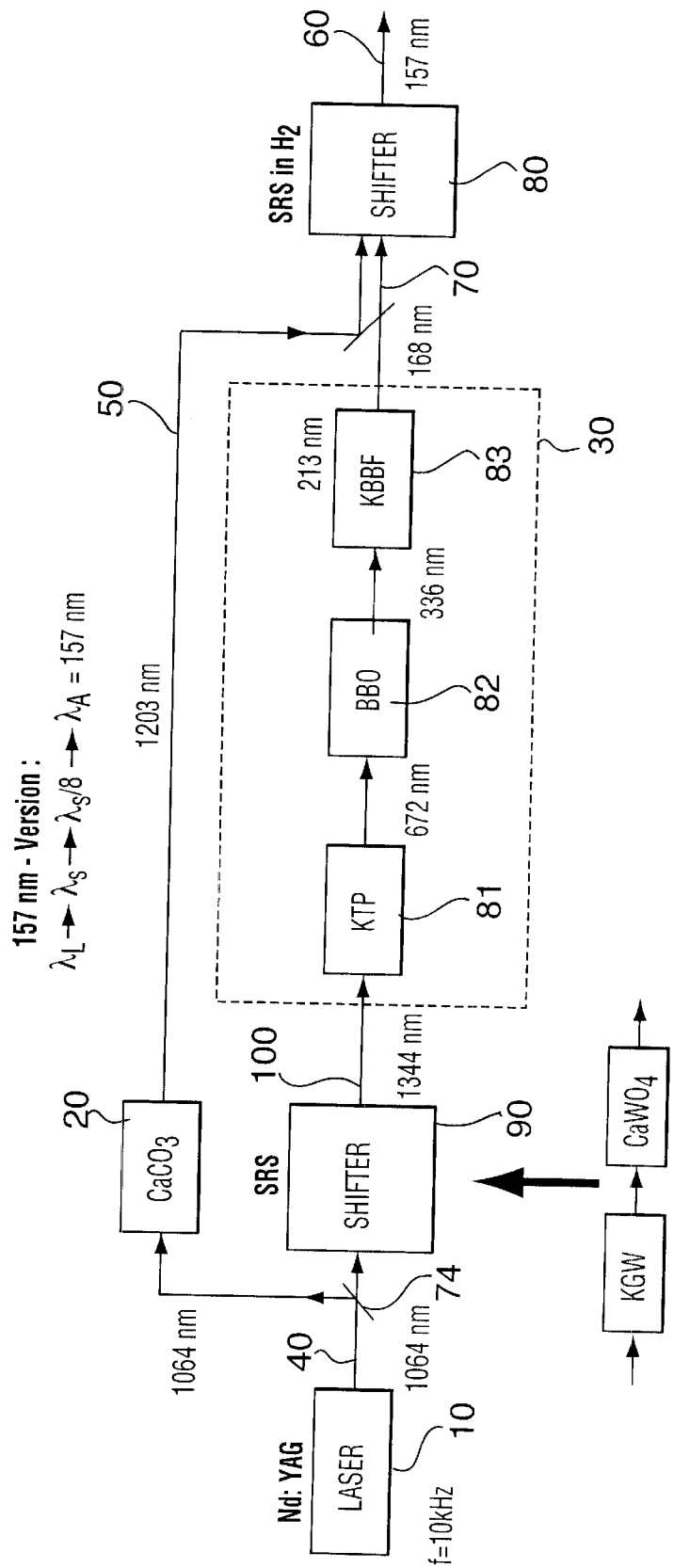
FIG. 12 is a detailed block diagram of a possible configuration of the fourth embodiment of the invention.

A third embodiment of the invention, producing an output beam with a wavelength of 157 nm, is shown in FIG. 12. This embodiment has five stages: an input/pump laser stage 10, a first phase conjugating SRS Stokes shift stage 20, an HG stage 30, a second phase conjugating SRS Stokes shift stage 90, and an SRS anti-Stokes shift stage 80. The first phase conjugating SRS Stokes shift stage 20 receives the input beam 40 and produces a Stokes shifted beam 50. The second phase conjugating SRS Stokes shift stage 90 also receives the input beam 40 and produces the intermediate Stokes shifted beam 100. The HG stage 30 produces the 8th harmonic of this intermediate Stokes shifted beam 65 and, in combination with the 1203 nm first Stokes shifted beam 50, is fed into the SRS anti-Stokes shift stage 80. This anti-Stokes shift stage 80 produces the desired beam with a wavelength of 157 nm. In this configuration, the first phase conjugating SRS Stokes shift stage 20 is constructed out of calcite crystal ($CaCO_3$). This stage produces a phase conjugated Stokes shifted 1203 nm wavelength beam from the input beam 40. The second phase conjugating SRS Stokes shift stage 90 is comprised of cascaded nonlinear optical crystals with potassium gadolinium tungstate (KGW) as the first part of the cascade and calcium tungstate ($CaWO_4$) as the second part of the cascade. The SRS anti-Stokes shift stage 80 is similar to that outlined in the embodiment illustrated in FIG. 10.

In FIG. 12 the HG stage is only composed of three substages 81, 82, 83. The first substage 81 can be a KTP frequency doubler producing a second harmonic of the Stokes shifted beam 50. The second substage 82 can be a BBO nonlinear crystal producing the fourth harmonic of the intermediate Stokes shifted beam 65. The final substage can be a KBBF crystal producing the eighth harmonic of the intermediate Stokes shifted beam 100.

It should be noted that in all the embodiments disclosed above, the input laser contained in the input/pump laser stage 10 can be either an Nd:YAG or an Nd:YLF diode pumped laser. The preferred version uses an Nd:YAG laser pulsed at a frequency of 10 kHz and producing a beam with a wavelength of 1064 nm and having a power of 6mJ. The input/pump laser ideally has a pump beam with a wavelength between 1 and 1.1 microns. It should further be noted that the HG stage 30 can be constructed out of sequentially disposed nonlinear optical crystals such as KTP, BBO, KBBF, and LBO. A person skilled in the art can determine the required sequence and composition of the HG stage 30 to provide a required harmonic.

The laser system disclosed above can easily be adapted for use in microlithographic applications by the person skilled in the art. By using well-known components and methods such as focussing lenses and other support mechanisms, the output beam produced can be focussed and pulsed to etch circuits and circuit elements on substrates.

A person understanding this invention may now conceive of alternative structures and embodiments or variations of the above all of which are intended to fall within the. scope of the invention as defined in the claims that follow.

The embodiments of the invention in which an exclusive property or privilege is claimed are defined as follows:

1. A multiple stage solid state laser system for producing an output beam having a wavelength in the ultraviolet range from a beam having a higher wavelength than the output beam, the system comprising:
   a first stage which produces an input beam;
   an intermediate stage following the first stage which receives the input beam and produces at least one second beam; and
   an output stage which receives the at least one second beam from the intermediate stage and which provides the output beam; wherein
   the first stage comprises a pump laser which produces the input beam having a suitable frequency;
   the intermediate stage comprises at least one internal stage chosen from the group consisting of:
      a phase conjugating frequency conversion stage for shifting the frequency of a beam internal to the internal stage from a first frequency to a second frequency using phase conjugation; and
      a harmonic generation stage for generating an nth harmonic of a beam internal to the internal stage, n being an integer greater than 1;
   the at least one internal stage of the intermediate stage produces the at least one second beam;
   the output stage comprises a device chosen from the group consisting of:
      phase conjugation means for shifting the frequency of the at least one second beam using phase conjugation to produce the output beam; and
      harmonic generation means for generating an mth harmonic of the at least one second beam to produce the output beam, m being an integer greater than 1;
   and wherein in the intermediate stage:
      (i) at least one internal stage receives the input beam;
      (ii) at least one internal stage produces the at least one second beam; and
      (iii) all the internal stages are optically linked in a pre-chosen path.

2. A system as in claim 1 wherein the intermediate stage comprises at least two stages arranged in parallel.

3. A laser system as in claim 2 wherein the intermediate stage includes a pair of parallel phase conjugating frequency conversion stages, each receiving the input beam.

4. A laser system as in claim 3 further including a pair of harmonic generation stages each positioned between one of the pair of frequency conversion stages and the output stage and for each of the frequency conversion stages, the frequency conversion stage produces an intermediate beam received by a corresponding one of the pair of harmonic generation stages for generating an nth harmonic of the intermediate beam, each nth harmonic generated being one of the at least one second beam.

5. A laser system as in claim 4 wherein the output stage is a phase conjugating frequency conversion stage for converting the at least one second beam into the output beam using phase conjugation.

6. A laser system as in claim 4 wherein the output stage is a harmonic generation stage for generating an nth harmonic of the at least one second beam, the nth harmonic being the output beam and n being an integer greater than 1.

7. A laser system as in claim 3 further including a harmonic generation stage positioned between one of the pair of frequency conversion stages and the output stage wherein for one of the pair of phase conjugating frequency conversion stages, the frequency conversion stage produces an intermediate beam received by the harmonic generation stage, the harmonic generation stage being for generating an nth harmonic of the intermediate beam, the nth harmonic being one the at least one second beam and an output of the other frequency conversion stage being another of the at least one second beam.

8. A laser system as in claim 7 wherein the output stage is a phase conjugating frequency conversion stage.

9. A system as in claim 1 wherein the intermediate stage comprises at least two stages arranged in series.

10. A system as in claim 1 wherein the intermediate stage comprises at least three stages of which at least two are arranged in parallel.

11. A laser system as in claim 2 wherein the intermediate stage comprises:
   a harmonic generation stage receiving the input beam and producing an nth harmonic of the input beam as one of the at least one second beam;
   a phase conjugating frequency conversion stage receiving the input beam and producing one of the least one second beam from the input beam using phase conjugation, and wherein
the output stage comprises a frequency conversion stage.

12. A laser system as in claim 1 wherein the frequency conversion stage includes components chosen from the group consisting of:
   a phase conjugating SRS Stokes cell transmitting a phase conjugated Stokes shifted beam; and
   a phase conjugating SRS anti-Stokes cell transmitting a phase conjugating anti-Stokes shifted beam.

13. A laser system as in claim 1 wherein the at least one second stage of the intermediate stage shifts the frequency of the input beams by passing the input beam through a frequency conversion stage, the frequency conversion stage including components chosen from the group consisting of:
   a phase conjugating SRS Stokes cell transmitting a phase conjugated Stokes shifted beam; and
   a phase conjugating SRS anti-Stokes cell transmitting a phase conjugating anti-Stokes shifted beam.

14. A method of producing laser light having a wavelength in the ultraviolet range, the method comprising:
   producing a pulsed input beam from an input beam source
   passing the input beam through at least one initial wavelength altering apparatus to produce at least one first intermediate beam, the initial wavelength altering apparatus being chosen from the group consisting of:
      a phase conjugating Raman medium cell; and
      an optical harmonic generation apparatus,
      passing the at least one first intermediate beam through a secondary wavelength altering apparatus to produce an output beam, the secondary wavelength apparatus being chosen from the group consisting of:
         a phase conjugating Raman medium cell; and
         an optical harmonic generation apparatus.

15. A method as in claim 14 further including passing the first intermediate beam through a secondary wavelength altering apparatus to produce a second intermediate beam, the secondary wavelength apparatus comprising a phase conjugating Raman medium cell producing a phase conjugated anti-Stokes shifted beam.

16. A method as in claim 14 further including the step of using at least one phase conjugating SRS Stokes cell to produce a phase conjugated Stokes shifted beam.

17. A method as in claim 14 further including the step of using an optical harmonic generation apparatus to produce fixed harmonics of a laser beam.

18. A method as in claim 14 further including the step of using at least one phase conjugating SRS Anti-Stokes cell to produce a phase conjugated anti-Stokes shifted beam.

* * * * *